United States Patent

[11] 3,629,724

[72] Inventor Kazumasa Shiga
Kadoma, Osaka, Japan

[21] Appl. No. 839,154
[22] Filed July 7, 1969
[45] Patented Dec. 21, 1971
[73] Assignee Matsushita Electric Industrial Company, Limited
Osaka, Japan
[32] Priorities July 19, 1968
[33] Japan
[31] 43/51425;
Sept. 18, 1968, Japan, No. 43/68594

[54] SEMICONDUCTOR OSCILLATING-RESONANCE CIRCUIT DEVICE
3 Claims, 5 Drawing Figs.

[52] U.S. Cl. .......... 331/96, 307/303, 317/235 K, 331/107 G, 331/108 C
[51] Int. Cl. .......... H03b 7/14
[50] Field of Search .......... 333/15, 70 S, 80, 80 T; 317/234 (9), 234 (18); 307/299, 320, 298, 303; 334/15; 331/107, 115, 96, 107 G, 108 C

[56] References Cited

UNITED STATES PATENTS

| | | | |
|---|---|---|---|
| 3,022,472 | 2/1962 | Tanenbaum et al. | 317/234 (9) UX |
| 3,384,829 | 5/1968 | Sato | 307/320 X |
| 3,426,249 | 2/1969 | Smyth | 317/234 (9) UX |
| 3,477,033 | 11/1969 | Goetzberger et al. | 317/234 (9) UX |
| 3,483,443 | 12/1969 | Mayer et al. | 317/234 (9) UX |
| 3,489,953 | 1/1970 | Thomas | 317/235 (22) UX |

OTHER REFERENCES

Brennan et al., " Transmission Line Biasing," IBM Technical Disclosure Bulletin, Vol. II, No. 7, Dec. 1968, p. 700

*Primary Examiner*—Herman Karl Saalbach
*Assistant Examiner*—Paul L. Gensler
*Attorney*—John Lezdey

ABSTRACT: A semiconductor oscillating-resonance circuit device is provided, which comprises a first plate electrode, a substrate disposed on the first electrode and having a negative resistance under a strong electric field, a spiral induction element having an inductance disposed at the opposite side of the substrate to the first plate electrode, an insulating layer disposed between the substrate and the induction element for providing a capacitance between the first electrode and the induction element, a second electrode connected to the one end of the induction element and ohmically contacted with the substrate, electric terminal connected to the other end of the induction element, and a DC power source connected to the first plate electrode and the electric terminal for establishing the strong electric field in the substrate.

The thus-constructed device generates a high-frequency signal having a frequency determined by the inductance and the capacitance.

INVENTOR
KAZUMASA SHIGA
BY John Lezdey
ATTORNEY

SEMICONDUCTOR OSCILLATING-RESONANCE CIRCUIT DEVICE

This invention relates to a semiconductor oscillating-resonance circuit device, and more particularly to an oscillating-resonance circuit device which is built by integrally forming a capacitor and inductance elements on the same semiconductor substrate.

One advantage of the present invention is that the oscillating-resonance circuit device comprises a semiconductor substrate of negative resistance under a strong electric field, an ohmic electrode formed on part of one side of the substrate by means of a deposit or alloy junction, another ohmic electrode built on the entire other side of the substrate forming one terminal by means of similar junction as described above, an insulating layer constructed of an oxide-, a ferrite-, or a semiconductor metal junction for providing a dielectric material for a capacitor, an induction element deposited with gold or aluminum on the insulating layer and connected at one end with the ohmic electrode for providing an inductance and a capacitance and an electric terminal formed on the insulating layer and connected with the other end of the induction element. Thus, this invention provides an extremely light and compact, mass-produceable semiconductive resonance circuit device which may be broadly utilized for a local oscillator of a television receiver or VHF communication receiver, and even a millimeter wave-generating element by providing a strip line.

This invention has, therefore, an object of providing a semiconductor oscillating-resonance circuit device which has a semiconductor substrate, an ohmic electrode formed on part of one side of the substrate, another ohmic electrode built on the entire other side of the substrate for forming one terminal, an insulating layer built on the one side of the substrate for providing a dielectric material for a capacitor, a conductor formed on the layer and connected at one end with the ohmic electrode, and an electric terminal formed on the layer and connected with the other end of the conductor.

The features and advantages of the present invention will become apparent from the following description used in conjunction with the accompanying drawings, in which.

Figure 1:
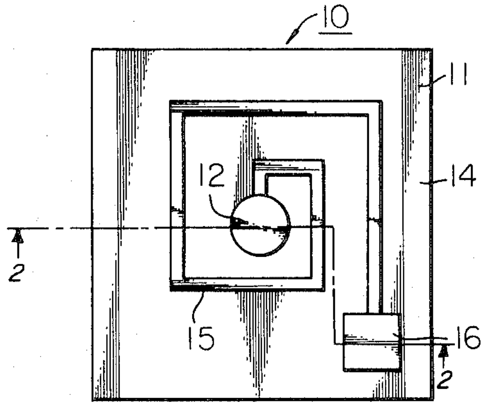
FIG. 1 is a plan view of a semiconductor resonance circuit device constructed in accordance with the present invention.
Figure 2:
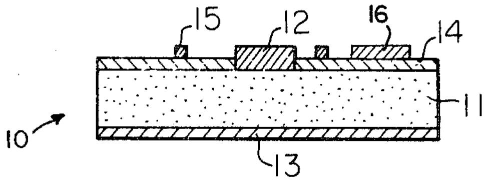
FIG. 2 is a sectional side view taken along line 2—2 of FIG. 1.

Reference is now made to FIGS. 1 and 2, which show one example of the semiconductor oscillating-resonance circuit device formed in accordance with the present invention. The oscillating-resonance circuit device 10 comprises a semiconductor substrate 11 of negative resistance under a strong electric field and is made of gallium arsenide, an ohmic electrode 12 formed on part on one side of the substrate 11 by means of a deposit or alloy junction and made of tin or indium, another ohmic electrode 13 built on the entire other side of the substrate 11 for forming one terminal by means of similar junction as described above with respect to the ohmic electrode 12, an insulating layer 14 which is 1 micron in thickness formed by an oxide, ferrite or semiconductor to metal junction for providing a dielectric material inserted into a capacitor, an induction element 15 of rectilinear spiral of Greek fret configuration deposited with a gold or aluminum and connected at one end with the ohmic electrode 12 for providing an inductance and capacitance, and an electric terminal 16 formed on the insulating layer 14 and connected with the other end of the induction element 15.

Figure 3:
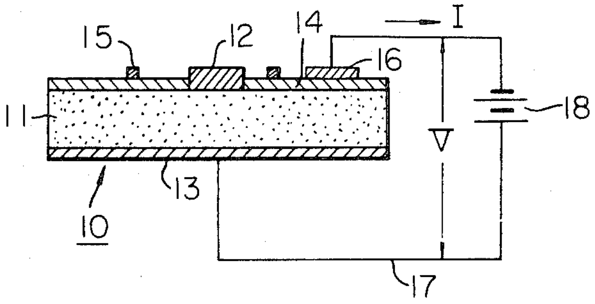
FIG. 3 is a schematic view of a connection of the semiconductor oscillating-resonance circuit device with a source of electric energy which comprises a semiconductor substrate of negative resistance under a strong electric field.
Figure 4:
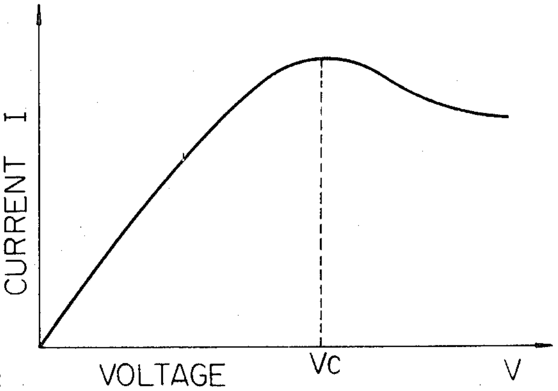
FIG. 4 is a graphical representation of the relationship between the current and voltage in the circuit shown in FIG. 3.

As seen in FIG. 3, which shows the connection of the semiconductor oscillating-resonance circuit device with a DC power supply, if the voltage V is applied through a line 17 connected between the electrode 13 and the terminal 16 from a source of DC power 18, the DC current flowing through the semiconductor oscillating-resonance circuit device 10 changes as shown in FIG. 4, which shows a graph of the relationship between the current and voltage in the circuit shown in FIG. 3. In the graph shown in FIG. 4 the voltage $V_c$ is a voltage when the maximum current flows through the semiconductor oscillating-resonance circuit device and varies in response to the distance between the ohmic electrodes 12 and 13. For example, when the distance between the ohmic electrodes 12 and 13 is 10 microns, the voltage $V_c$ is approximately 3 volts.

Figure 5:
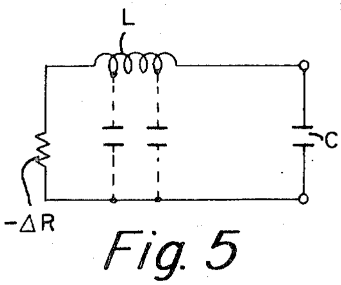
FIG. 5 is an equivalent circuit of the semiconductor oscillating device resonance circuit device.

It is understood from the graph that if a voltage more than $V_c$ is applied to the semiconductor oscillating-resonance circuit device 10, the device 10 has a negative resistance for alternating current flowing therethrough. Thus, under certain conditions the equivalent circuit of the semiconductor oscillating-resonance circuit is expressed as shown in FIG. 5 to cause the device to form an oscillating-resonance circuit. The aforementioned condition is the state in which the device 10 indicates a negative resistance and in which the electric field in the semiconductor should be maintained uniform. This uniform state may be maintained by preventing the formation of a high-voltage electric field domain in the semiconductor, which formation causes to occur Gunn-oscillation.

Suppose that this uniform state has been maintained, the frequency of the oscillation is defined by the inductance of the induction element and the capacitance between the induction element and the base electrode. The formation of such a high-voltage electric field domain depends on the amount of the electric charge $n$ and the traveling distance $l$ of the domain so that if the value of the product of the amount of the electric charge $n$ and the traveling distance $l$ of the domain is less than $10^{12}$ cm.$^{-2}$ a high-voltage electric field domain is hardly formed. It follows that if the specific resistance of the semiconductor is large enough and if the distance between the ohmic electrodes 12 and 13 is reduced as much as possible, the device 10 may not reach the state of Gunn-oscillation.

This invention will further become apparent from the following examples.

EXAMPLE I

The semiconductor resonance circuit device of an embodiment of this invention shown in FIG. 2 had a semiconductor substrate 11 of specific resistance of 1 ohm-cm. and made of gallium arsenide, 1 mm.$^2$ in area and 10 microns in thickness, and a spiral induction element 15 with 10 turns, whereupon its inductance was approximately 0.25 microhenry, its capacitance was approximately 10 picofarads, and its resonance frequency was approximately 100 megahertz. When the induction element 15 has a strip line configuration, the semiconductor resonance circuit device has a low inductance and capacitance with the result that a further higher resonance frequency could be obtained. Then, when the insulating layer 14 was formed by the depletion layer of the semiconductor metal junction, the capacitance of the device 10 could be changed by varying the DC bias voltage applied to the device 10 with the result that also the resonance frequency of the device 10 could be changed.

I claim:

1. A semiconductor oscillating-resonance circuit device comprising a first electrode, a substrate ohmically contacted with said first electrode and having a negative resistance under a strong electric field, an induction element at least partially facing to said first electrode and disposed at the opposite side of said substrate to said first electrode, an insulating layer disposed between said substrate and said induction element for providing a capacitance between said first electrode and said induction element, a second electrode electrically connected to the one end of said induction element and ohmically contacted with said substrate, an electric terminal electrically connected to the other end of said induction element, and a DC power source connected to said first electrode and said electric terminal for establishing said strong electric field in said substrate.

2. A semiconductor oscillating device according to claim 1, wherein said insulating layer is formed by insulating material selected from the group consisting of oxides and ferrites.

3. A semiconductor oscillating device according to claim 1, wherein said insulating layer is formed by a semiconductor metal junction.

* * * * *